United States Patent [19]

Hoffmann et al.

[11] 4,134,033
[45] Jan. 9, 1979

[54] FAST-SWITCHING DIGITAL DIFFERENTIAL AMPLIFIER SYSTEM FOR CCD ARRANGEMENTS

[75] Inventors: Kurt Hoffmann, Taufkirchen; Manfred Mauthe, Munich, both of Germany

[73] Assignee: Siemens Aktiengesellschaft, Berlin & Munich, Germany

[21] Appl. No.: 814,998

[22] Filed: Jul. 12, 1977

[30] Foreign Application Priority Data

Jul. 13, 1976 [DE] Fed. Rep. of Germany ....... 2631471

[51] Int. Cl.$^2$ .......................... H03K 5/18; H03K 5/02; H03K 17/04; G11C 7/00
[52] U.S. Cl. ............................... 307/362; 307/221 D; 307/246; 307/251; 307/279; 307/DIG. 3; 365/183; 365/204
[58] Field of Search ................... 307/221 D, 246, 279, 307/251, 304, DIG. 3; 357/24; 365/183, 204, 205

[56] References Cited

U.S. PATENT DOCUMENTS

| | | | |
|---|---|---|---|
| 3,758,794 | 9/1973 | Kosonocky | 307/304 |
| 3,765,002 | 10/1973 | Basse | 307/246 X |
| 3,876,989 | 4/1975 | Bankowski et al. | 307/304 X |
| 3,895,360 | 7/1975 | Cricchi et al. | 307/238 X |
| 3,946,368 | 3/1976 | Chou | 307/221 D X |
| 3,959,781 | 5/1976 | Mehta et al. | 307/238 X |
| 4,007,381 | 2/1977 | Mohsen | 307/362 X |
| 4,048,519 | 9/1977 | Hoffmann et al. | 307/221 D |
| 4,060,737 | 11/1977 | Gosney | 307/221 D |
| 4,074,206 | 2/1978 | Horninger | 307/221D |
| 4,075,515 | 2/1978 | Hoffmann | 307/221 D X |

OTHER PUBLICATIONS

Dennard, "Regeneration Circuit for Charge-Coupled Device Shift Registers"; *IBM Tech. Discl. Bull.;* vol. 14, No. 12, pp. 3791-3792; 5/1972.
Dennard et al., "Read/Write Amplifier for Charge-Coupled Device Memory"; *IBM Tech. Discl. Bull.;* vol. 14, No. 12, pp. 3722-3723; 5/1972.

*Primary Examiner*—Larry N. Anagnos
*Attorney, Agent, or Firm*—Hill, Gross, Simpson, Van Santen, Steadman, Chiara & Simpson

[57] ABSTRACT

A method and apparatus is disclosed for a fast switching digital differential amplifier system useful in regenerating information signals in charge coupled devices. The amplifier system has a first capacitance at an input point which is charged and discharged in accordance with a binary "0" or binary "1" at the input. A second capacitance and an output capacitance is provided with a predetermined charge thereon. In the event of a binary "1", the predetermined charge on the second and output capacitance is retained while the first capacitance is discharged. In the event of a binary "0", the second and output capacitances are discharged via a current sink. A flip-flop is connected to the output capacitance for accelerating the discharge of the same. Switching transistors are additionally provided for activating the flip-flop to achieve the desired fast-switching.

5 Claims, 4 Drawing Figures

FAST-SWITCHING DIGITAL DIFFERENTIAL AMPLIFIER SYSTEM FOR CCD ARRANGEMENTS

RELATED APPLICATION

This application is an improvement upon the digital differential amplifier described in co-pending patent application U.S. Ser. No. 717,690, now U.S. Pat. No. 4,075,515, of which, Kurt Hoffmann, a co-inventor in this case, is the sole inventor.

BACKGROUND OF THE INVENTION

The invention relates to a digital differential amplifier for CCD arrangements.

In CCD circuits it is necessary to regenerate the information after a specific number of transmissions in order to retain the original information. In this respect the regenerator stages are subject to a plurality of requirements. On the one hand they are to be independent of fluctuations in start voltage and supply voltage. On the other hand a reference voltage which is required for the analysis of the input signal is to be produced in the circuits themselves. The output amplitude of the regenerator stages is to be as high as possible. Furthermore, these regenerator stages are to facilitate the production of a determinate basic charge in the CCD. Finally they are to fit into the CCD pattern.

Co-pending patent application U.S. Ser. No. 717,690 filed Aug. 8, 1976, now U.S. Pat. No. 4,075,515, describes a differential amplifier for CCD regenerator stages which largely fulfills the above described requirements. However, it is desirable to improve switching times of such an amplifier.

SUMMARY OF THE INVENTION

An object of the present invention consists in improving upon the aforementioned digital differential amplifier for CCD arrangements to the extent that a substantial reduction in switching time is achieved.

According to the invention, a first capacitance is provided at an input point of the differential amplifier. This first capacitance is charged and discharged in accordance with a binary "0" and binary "1" appearing at the input. A second capacitance and an output capacitance is provided with a predetermined charge thereon. In the event of a binary "1", the predetermined charge is retained on the second and output capacitances while the first capacitance is discharged. In the event of a binary "0", the second and output capacitances are discharged via a current sink. In order to speed-up the above charge regeneration, a flip-flop is provided which is connected to the output point at which the output capacitance is provided. Circuitry is provided for activating this flip-flop and thus accelerating the discharge of the second and output capacitances by switching the flip-flop conductive.

DESCRIPTION OF THE PREFERRED EMBODIMENTS

Figure 1:
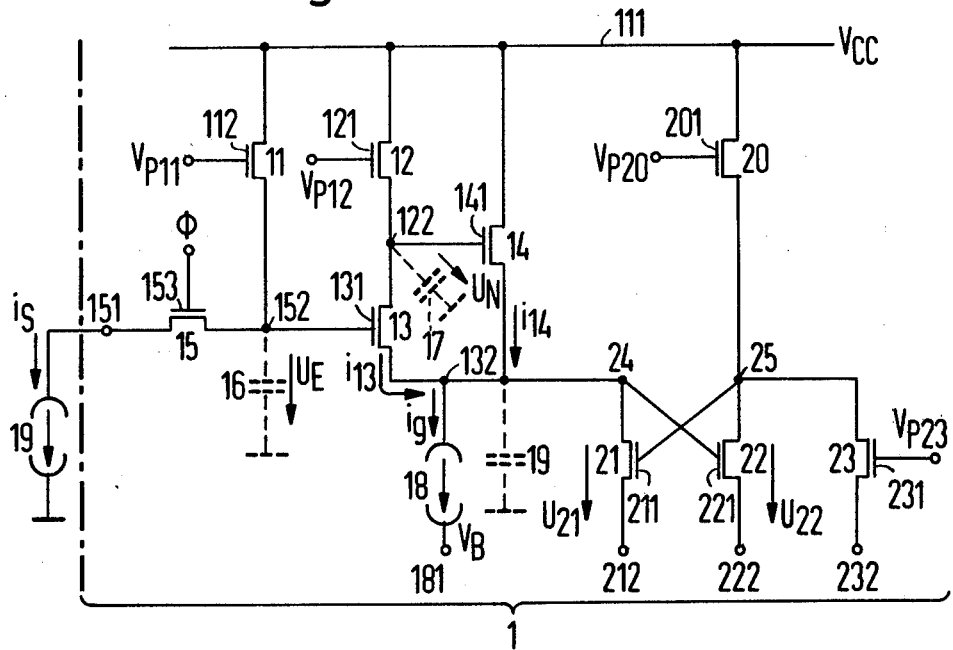
FIG. 1 is a schematic circuit diagram of a digital differential amplifier corresponding to the invention.

The digital differential amplifier 1 illustrated in FIG. 1, which is also partially described in Patent application U.S. Ser. No. 717,690, fundamentally consists of transistors 11 to 15. The transistor 15 is connected on the one hand to the input 151 and on the other hand to a point 152. The transistor 15 can be controlled by a pulse train $\phi$ present at its gate terminal 153. The transistor 11 is connected on the one hand to point 152 and on the other hand to a line 111 to which a supply voltage $V_{CC}$ is connected. The transistor 11 can be controlled via its gate terminal 112 by a potential $V_{P11}$. The point 152 is likewise connected to a gate terminal 131 of a transistor 13. The latter is in turn connected on the one hand to an output 132 and on the other hand to a transistor 12. The transistor 12 is connected on the one hand to a transistor 13 and on the other hand to the line 111. The transistor 12 can be controlled via its gate terminal 121 by a potential $V_{P12}$. The gate terminal 141 of a further transistor 14 is connected to the point 122 at which the transistors 12 and 13 are connected in series. The transistor 14 is connected on the one hand to the output 132 and on the other hand to the line 111. The transistors 11 and 12 serve to bias the parasitic capacitances 16 and 17, whereas the transistors 13 and 14, together with a current sink 18, produce a reference voltage and effect the amplification of the input signal. Here the current sink 18 is connected on the one side to the output 132 and on the other side to a terminal 181 to which the voltage $V_B$ is connected. The transistor 15 connects the input 151 to the nodal point 152.

In the following, the function of the circuit illustrated in FIG. 1 will be described in association with FIG. 3. At time $t_0$, the transistors 11 and 12 are switched on so that the parasitic capacitances 16 and 17 are charged to the voltage $V_{CC}$. If the transistors 13 and 14 possess the same geometric dimensions, the current which flows through them is $I_{13} = I_{14} = I_{G1/2}$, where $I_G$ is the current flowing through the current sink 18. Then a voltage of $U_A = V_{CC} - U_T$ is present at the output 132 of the differential amplifier 1, where $U_T$ is the start voltage of the transistors 11 to 15. At time $t_1$, the transistor 11 is switched off. This is achieved by switching off the potential $V_{P11}$ at the gate terminal 112. This results in no change in the voltage across the capacitor 16 and the current ratio $I_{13} = I_{14}$ is maintained. As illustrated in FIG. 1, the input 151 is connected to a current sink 19 where the presence of current $I_S$ corresponds to a binary "1" and the absence of the current $I_S = 0$ corresponds to a binary "0". When the transistor 15 is conductive, the capacitor 16 is thereby either discharged to the voltage $U_E = 0$ or remains biased at the voltage $U_E = V_{CC}$. In this way the output 132 can assume two different states at time $t_3$.

(a) When $U_E < V_{CC}$, the transistor 13 is switched off, as the voltage between its gate terminal and its source terminal is $U_E - U_A < U_T$. The voltage $U_N$ across the capacitance 17 remains at $U_N = V_{CC}$, and therefore the output voltage $U_A = V_{CC} - U_T$ is retained at the output 132 of the amplifier.

(b) If $U_E = V_{CC}$, the transistor 13 remains switched on, as a result of which the gate and the source terminal of the transistor 14 are connected to one another. This results in the transistor 14 being switched off and the current sink 18 discharging the output 132 in the direction $V_B$.

The two states (a) and (b) are subject to the condition that transistor 12 should be blocked.

As the output voltage $U_A$ is dependent only upon the ratio of the voltage $U_N$ to $U_E$ across the capacitances 16 and 17, where $U_A = V_{CC} - U_T$, when $U_E < U_N$, and $U_A = V_B$ when $U_E = U_N$, fluctuations in supply voltage and start voltage have no influence upon the amplification process.

Figure 2:
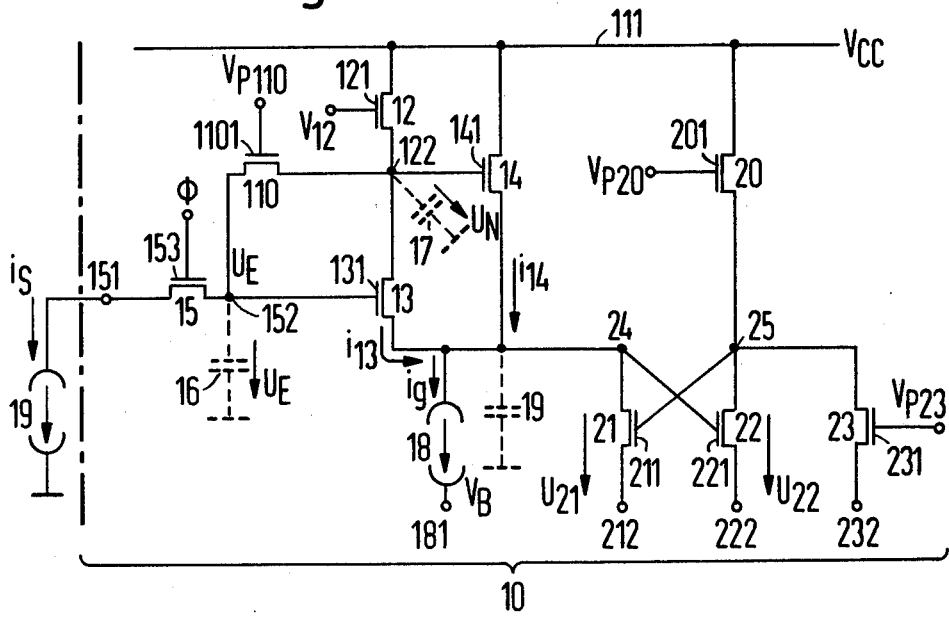
FIG. 2 illustrates an alternate embodiment of the circuit shown in FIG. 1.

FIG. 2 illustrates an alternate embodiment 10 of the digital differential amplifier 1 shown in FIG. 1. Here, details of FIG. 2 which have already been described in association with FIG. 1 bear the corresponding references. The transistor 110 which corresponds to the transistor 11 in FIG. 1, is not, as in FIG. 1, connected on the one hand to the point 112 and on the other hand to the line 111. Instead the transistor 110 is connected on the one hand to the point 152 and on the other hand to the nodal point 122. This has the advantage that the voltage drop which occurs across the transistor 12 when the capacitance 17 is biased affects the capacitance 16 to the same extent. In this way, voltage differences across the two capacitances 16 and 17 are advantageously avoided.

As can be seen from FIGS. 1 and 2, the digital differential amplifiers corresponding to the invention have additional transistors 20 to 23. The transistor 20 which can be controlled by the potential $V_{P20}$ present across its gate 201, is connected on the one hand to the supply voltage line 111 and on the other hand to a transistor 22. The transistor 22 is connected on the one hand to the transistor 20 and on the other hand to a terminal 222 which preferably is at ground potential. The gate 221 of the transistor 22 is connected to the point 24 of the differential amplifier. This point 24 carries the potential $U_A$. The transistor 21 is connected on the one hand to the point 24 and on the other hand to the terminal 212 which preferably likewise is at ground potential. The gate 211 of the transistor 21 is connected to point 25 at which the transistors 20 and 22 are connected in series. The transistors 21 and 22 form a flip-flop. The transistor 23 is connected in parallel with the transistor 22, and can be controlled across its gate 231 by the potential $V_{P23}$. The transistor 23 is connected on the one hand to point 25 and on the other hand to terminal 232, which preferably again is at ground potential.

Figure 4:
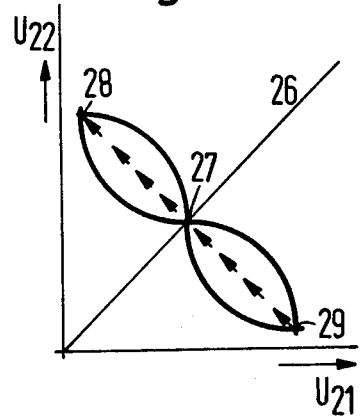
FIG. 4 illustrates a characteristic curve of a flip-flop in the circuit of the invention.

FIG. 4 illustrates the behavior of the flip-flop in dependence upon the voltages $U_{21}$ and $U_{22}$ connected to the points 24 and 25. The straight line 26 separates the two stable states 28 and 29 from one another.

In the following, the function of the flip-flop is to be described in association with the transistors 23 and 20 serving to reduce the switching time of the differential amplifier. Until time $t_3$, the terminal 201 of the transistor 20 is connected to a potential of 0 V and the terminal 231 of the transistor 23 is connected to the potential $V_{P23}$. This causes the transistor 20 to block, the transistor 23 to become conductive, and a potential of 0 V to be connected to point 25. Thus a determinate starting state exists. At the time $t_3$ the flip-flop is activated. The terminal 201 of the transistor 20 is then connected to potential $V_{P20}$, and the terminal 231 of the transistor 23 is connected to potential 0 V. This causes the transistor 20 to become conductive and the transistor 23 to block.

In the one situation in which the voltage $U_A = V_{CC} - U_T$, the transistor 22 remains conductive even when the transistor 23 blocks. On activation, the flip-flop is set to the stable point 29 (FIG. 4).

In the other situation, in which the voltage $U_A$ is discharged by the current source, the flip-flop first triggers at line $t_3$ back to point 29 at the time $t_3$, since $U_A$ has initially only slightly discharged. The discharge of the output node 24 is primarily determined only by the current source 18, and $U_{21} = U_A$ reduces. The voltages $U_{21}$ and $U_{22}$ change along the state trajectory indicated by arrows in FIG. 4. If the state trajectory exceeds the separating line 26, the flip-flop can no longer trigger into the state 29 and from then on the switching time is fundamentally determined by the switching time of the flip-flop.

A symmetrical flip-flop is obtained if the switching transistors 21 and 22 are identical and the load transistors 14 and 20 are identical. Fluctuations in the start voltages of these transistors give rise to asymmetry and a shifting of the separating line. A displacement of the center point 27 indicates that the time triggering is varying. The separating line is overshot at an earlier or later point than the symmetrical flip-flop so that the reduction in switching time is increased or reduced.

Figure 3:
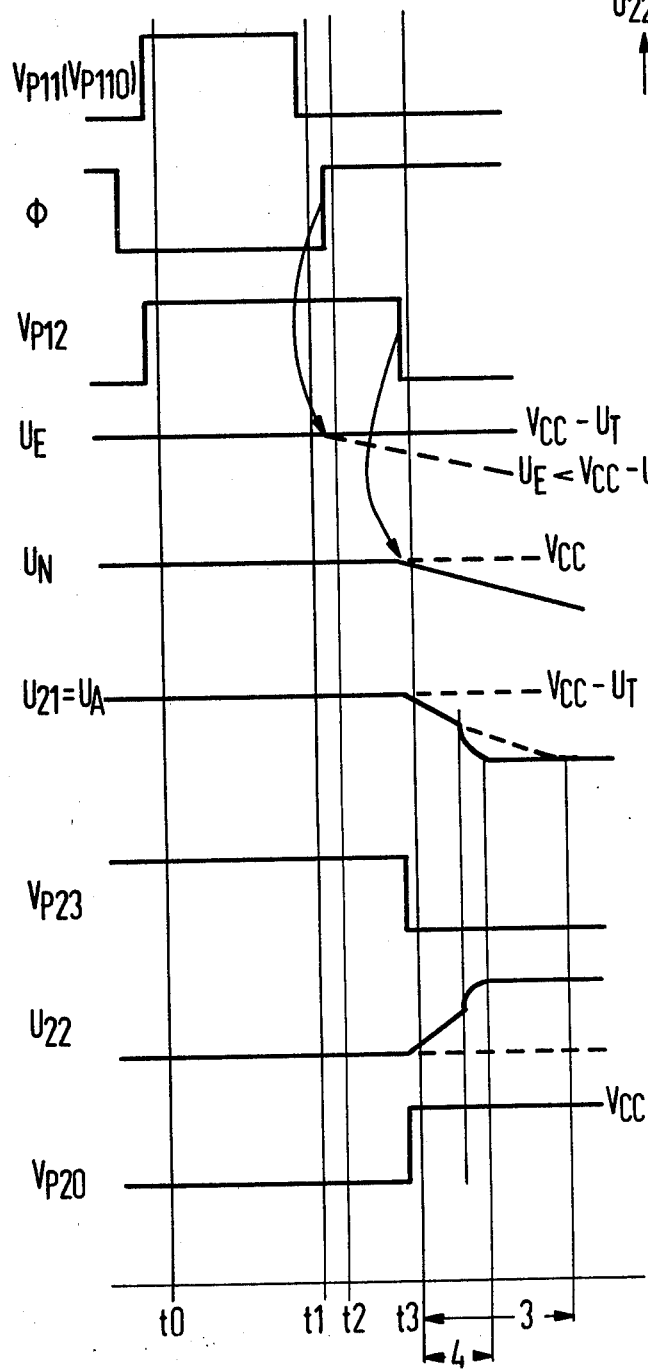
FIG. 3 is a time diagram for the circuits shown in FIGS. 1 and 2.

In FIG. 3, arrow 3 indicates the switching time of the regenerator circuit without the flip-flop, and arrow 4 indicates the switching time of the regenerator circuit with the flip-flop. As can readily be seen, the flip-flop produces a considerable reduction in switching time.

As described in U.S. patent application Ser. No. 717,690, the circuits corresponding to the invention illustrated in FIGS. 1 and 2 can be employed in association with output stages and input stages of CCD arrangements. Ser. No. 717,690 likewise illustrates current sinks such as are employed in association with the differential amplifier corresponding to the invention. The circuits shown in FIGS. 1 and 2 can likewise be constructed in accordance with the technology described in Ser. No. 717, 690.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A digital differential amplifier for CCD (charge coupled device) arrangements, comprising:
    a first transistor connected to an input point, the first transistor being controlled via:
    a gate terminal by a first control potential;
    a first capacitance provided between the input point and a first supply voltage terminal;
    a second transistor having a gate terminal connected to the input point, the second transistor being connected to an output point of the differential amplifier;
    a third transistor connected between the second transistor and a second supply voltage terminal, the third transistor being controlled via a gate terminal by a second control potential;
    a second capacitance provided between a junction of the second and third transistors and the first supply voltage terminal;
    a fourth transistor having a gate terminal connected to said junction of the second and third transistors, the fourth transistors being connected between the second supply voltage terminal and said output point;
    a third capacitance provided between said output point and the first supply voltage terminal;

a current sink connected to said output point;
a fifth transistor connected between said output point and the first supply voltage terminal;
a sixth transistor connected between a gate of the fifth transistor and the second supply voltage terminal;
a seventh transistor connected between the gate of the fifth transistor and the first supply voltage terminal, a gate of the seventh transistor being connected to the output point, the fifth and seventh transistors forming a flip-flop; and
an eighth transistor having a control voltage connected to its gate terminal is connected between a junction of the sixth and seventh transistors and the first supply voltage terminal;
whereby the sixth and eighth transistors activate the flip-flop to hasten discharge of the third capacitance at the output point.

2. A differential amplifier as claimed in claim 1, characterized in that the first transistor is connected between the input point and the second supply voltage terminal.

3. A differential amplifier as claimed in claim 1, characterized in that the first transistor is connected between the input point and the junction of the second and third transistors.

4. A differential amplifier as claimed in claim 1, characterized in that at the input point of the differential amplifier there is arranged a ninth transistor which can be controlled via its gate terminal by a pulse train.

5. A differential amplifier as claimed in claim 1, characterized in that the transistors of the differential amplifier are aluminum-silicon technique field effect transistors.

* * * * *